(12) United States Patent
Larsen et al.

(10) Patent No.: US 8,723,584 B2
(45) Date of Patent: May 13, 2014

(54) LOW POWER DUAL VOLTAGE MODE RECEIVER

(71) Applicant: Conexant Systems, Inc., Irvine, CA (US)

(72) Inventors: Christian Larsen, Irvine, CA (US); Mark R. Tennyson, Irvine, CA (US)

(73) Assignee: Conexant Systems, Inc., Irvine, CA (US)

( * ) Notice: Subject to any disclaimer, the term of this patent is extended or adjusted under 35 U.S.C. 154(b) by 0 days.

(21) Appl. No.: 13/887,230

(22) Filed: May 3, 2013

(65) Prior Publication Data

US 2013/0293278 A1 Nov. 7, 2013

Related U.S. Application Data

(60) Provisional application No. 61/642,321, filed on May 3, 2012.

(51) Int. Cl.
*H03L 5/00* (2006.01)

(52) U.S. Cl.
USPC .......................................... 327/333

(58) Field of Classification Search
None
See application file for complete search history.

(56) References Cited

U.S. PATENT DOCUMENTS

| | | | |
|---|---|---|---|
| 4,958,091 A | 9/1990 | Roberts | |
| 5,469,082 A | 11/1995 | Bullinger et al. | |
| 6,288,591 B1 | 9/2001 | Riccio | |
| 6,353,524 B1 | 3/2002 | Sloan | |
| 6,777,997 B2* | 8/2004 | Tahara et al. | 327/333 |
| 7,046,049 B2* | 5/2006 | Deppe | 327/108 |
| 7,518,450 B2* | 4/2009 | Wendt et al. | 330/251 |
| 7,564,274 B2* | 7/2009 | Hughes | 327/108 |
| 7,772,887 B2 | 8/2010 | Shankar et al. | |
| 7,956,641 B1 | 6/2011 | Peng et al. | |
| 8,138,813 B2* | 3/2012 | Inose | 327/333 |
| 8,558,585 B2* | 10/2013 | Ishimatsu | 327/108 |
| 8,564,363 B1* | 10/2013 | Wang | 327/552 |
| 8,593,203 B2* | 11/2013 | Shankar et al. | 327/333 |
| 2012/0056657 A1* | 3/2012 | Inose | 327/333 |
| 2013/0293278 A1* | 11/2013 | Larsen et al. | 327/333 |

* cited by examiner

*Primary Examiner* — Lincoln Donovan
*Assistant Examiner* — Khareem E Almo
(74) *Attorney, Agent, or Firm* — Jackson Walker L.L.P.; Christopher J. Rourk

(57) ABSTRACT

A dual-voltage receiver, comprising a voltage detector. A high voltage Schmitt trigger coupled to the voltage detector. A low voltage Schmitt trigger coupled to the voltage detector. A combined level shifter coupled to the high voltage Schmitt trigger and the low voltage Schmitt trigger, wherein the high voltage Schmitt trigger is on and the low voltage Schmitt trigger is off when the voltage detector outputs a high voltage detect signal.

20 Claims, 4 Drawing Sheets

US 8,723,584 B2

LOW POWER DUAL VOLTAGE MODE RECEIVER

RELATED APPLICATIONS

The present application claims benefit of U.S. provisional patent application 61/642,321, filed May 3, 2012, which is hereby incorporated by reference for all purposes as if set forth herein in its entirety.

TECHNICAL FIELD

The present disclosure relates to a dual voltage mode receiver, and more particuarly to a dual voltage mode receiver for input/output applications.

BACKGROUND OF THE INVENTION

Some input/output interfaces require operation at multiple voltages. For example, an I2S interface can operate at either 3.3 V or 1.8 V, and Intel's HD-Audio specification allows for operation at 3.3 V and 1.5 V. Such interfaces must be tolerant of the higher voltages, which makes them difficult to operate at the lower voltage. In a CMOS design, this is because high-voltage transistors (suited for 3.3 V operation) have a large voltage threshold. When used with low voltage, the transistors are operated with very little overdrive, reducing their current drive, which reduces the speed of the circuit.

SUMMARY OF THE INVENTION

A dual-voltage receiver, comprising a voltage detector is provided. The dual-voltage receiver includes a high voltage Schmitt trigger and a low voltage Schmitt trigger, each connected to the voltage detector. A combined level shifter is connected to the high voltage Schmitt trigger and the low voltage Schmitt trigger, wherein the high voltage Schmitt trigger is on and the low voltage Schmitt trigger is off when the voltage detector outputs a high voltage detect signal.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which.

DETAILED DESCRIPTION OF THE INVENTION

Figure 1:
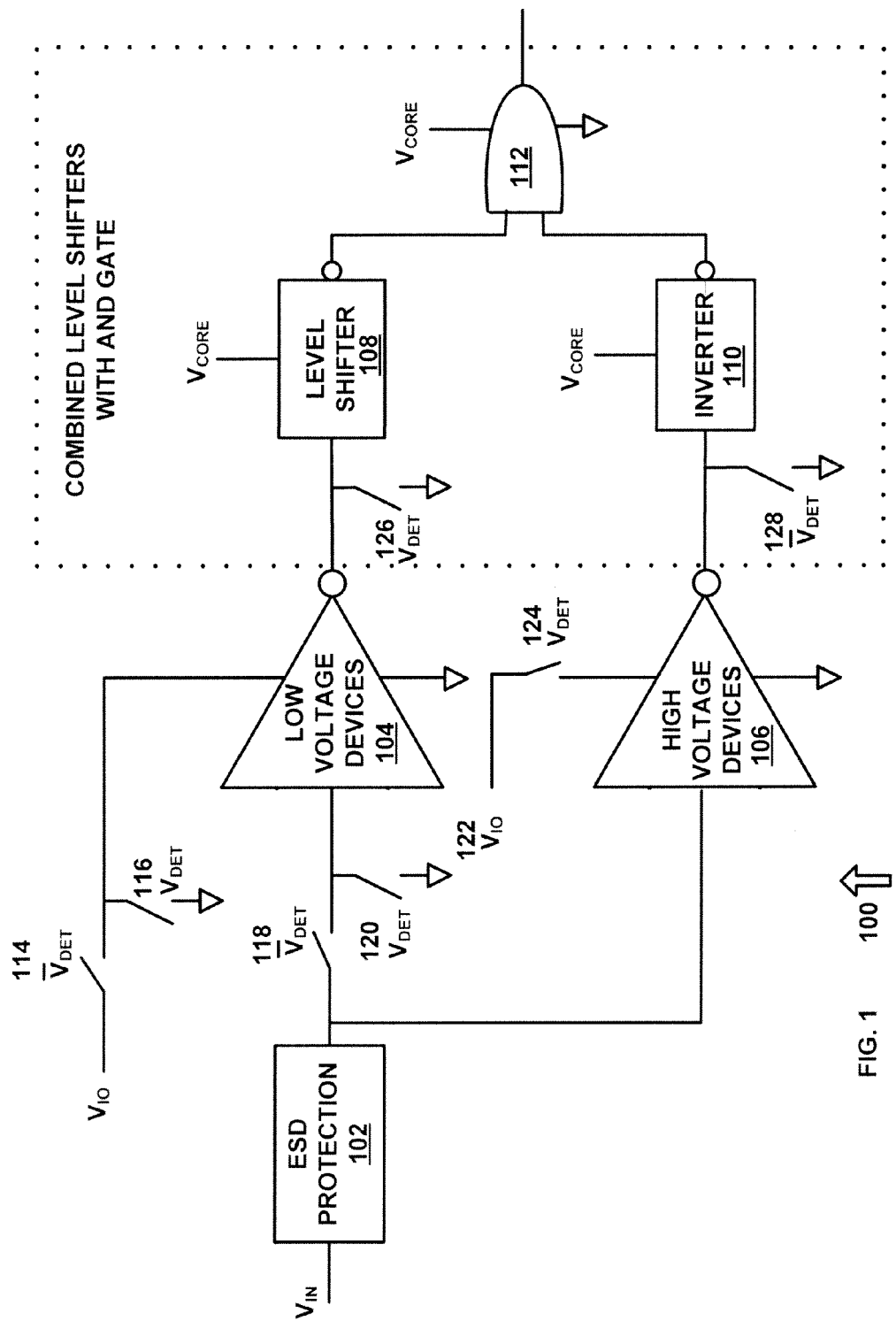
FIG. 1 is a diagram of a system for a low-power dual voltage-mode receiver for digital input/output in accordance with an exemplary embodiment of the present disclosure.

In the description that follows, like parts are marked throughout the specification and drawings with the same reference numerals. The drawing figures might not be to scale and certain components can be shown in generalized or schematic form and identified by commercial designations in the interest of clarity and conciseness.

Some IO interfaces have operational requirements at multiple voltages. For example, an I2S interface can operate at either 3.3 V or 1.8 V, and Intel's HD-Audio specification allows for operation at 3.3 V and 1.5 V. Because of these voltage requirements, such interfaces must be tolerant of the higher voltages, which makes them difficult to operate at the lower voltage. In a CMOS design, this difficulty is encountered because high-voltage transistors (suited for 3.3 V operation) have a large voltage threshold. When used with low voltage, the transistors are operated with very little overdrive, reducing their current drive and the speed of the circuit.

Intel's HD audio specification, High Definition Audio Specification Revision 1.0a, dated Jun. 17, 2010, and which is hereby incorporated by reference for all purposes as set forth herein in its entirety, is particularly challenging due to the large difference of voltage, and the timing requirements imposed by the specification, as input receivers delays must be kept at a minimum.

The present disclosure is based on a comparator design. One disadvantage with a comparator-based design is its high power consumption. Because a comparator is a constant-biased circuit, it has a high quiescent current consumption, even when the data does not change state. The amount of power consumed is related to the speed of the circuit—the circuit must be biased to meet the timing requirements of the HD audio specification. The present disclosure uses circuits that are common to input receivers, such as a CMOS inverting Schmidt trigger, to solve the problem of high current consumption. By using different types of transistors, the receiver is split in two: one circuit that uses high voltage transistors for 3.3V operation, and one circuit that uses low voltage transistors for 1.5V operation. The output of each is then level shifted to the chip's core voltage and combined using an AND gate. As the optimum transistor type is used for each voltage mode, the performance of the receiver is also optimized for each voltage mode. This optimization allows for a design that is smaller, and has lower dynamic power consumption for a given performance.

To avoid voltage tolerance issues during 3.3 V operation in the low-voltage circuit, switches are used to disable the low-voltage circuit. Switches disconnect both the input signal and the supply voltage of the low-voltage circuit such that it is never exposed to any voltage above the transistors' limits. A voltage detector circuit is used to generate the controls of the switches. The switches use high-voltage transistors.

Notably, the present disclosure has no quiescent current consumption, is smaller in area and has higher performance at lower dynamic current consumption.

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications or on two or more processors, or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections.

FIG. 1 is a diagram of a system 100 for a low-power dual voltage-mode receiver for digital input/output in accordance with an exemplary embodiment of the present disclosure. System 100 includes ESD protection 102 at the input, and voltage detector 130 having an output $V_{DET}$ that is used to detect the voltage mode of operation (e.g. high or low). Depending on the detected mode, the configuration switches 114, 116, 118, 120, 122, 124, 126 and 128 select high voltage devices 106 or low voltage devices 104 for the amplifier and level shifters. In addition, the level shifter 108 and AND gate 112 are combined, as described in greater detail herein.

In operation, when the input voltage is a high voltage signal, such that the voltage detector signal $V_{DET}$ is high, switches 116, 120, 124 and 126 are closed and switches 114, 118 and 128 are opened, so that low voltage devices 104 are isolated from the input voltage and to allow high voltage devices 106 to process the input signal. When the input voltage is a low voltage signal, such that the voltage detector signal $V_{DET}$ is low, switches 116, 120, 124 and 126 are open and switches 114, 118 and 128 are closed, so that high voltage devices 106 are isolated from the input voltage and to allow low voltage devices 104 to process the input signal.

Figure 2A:
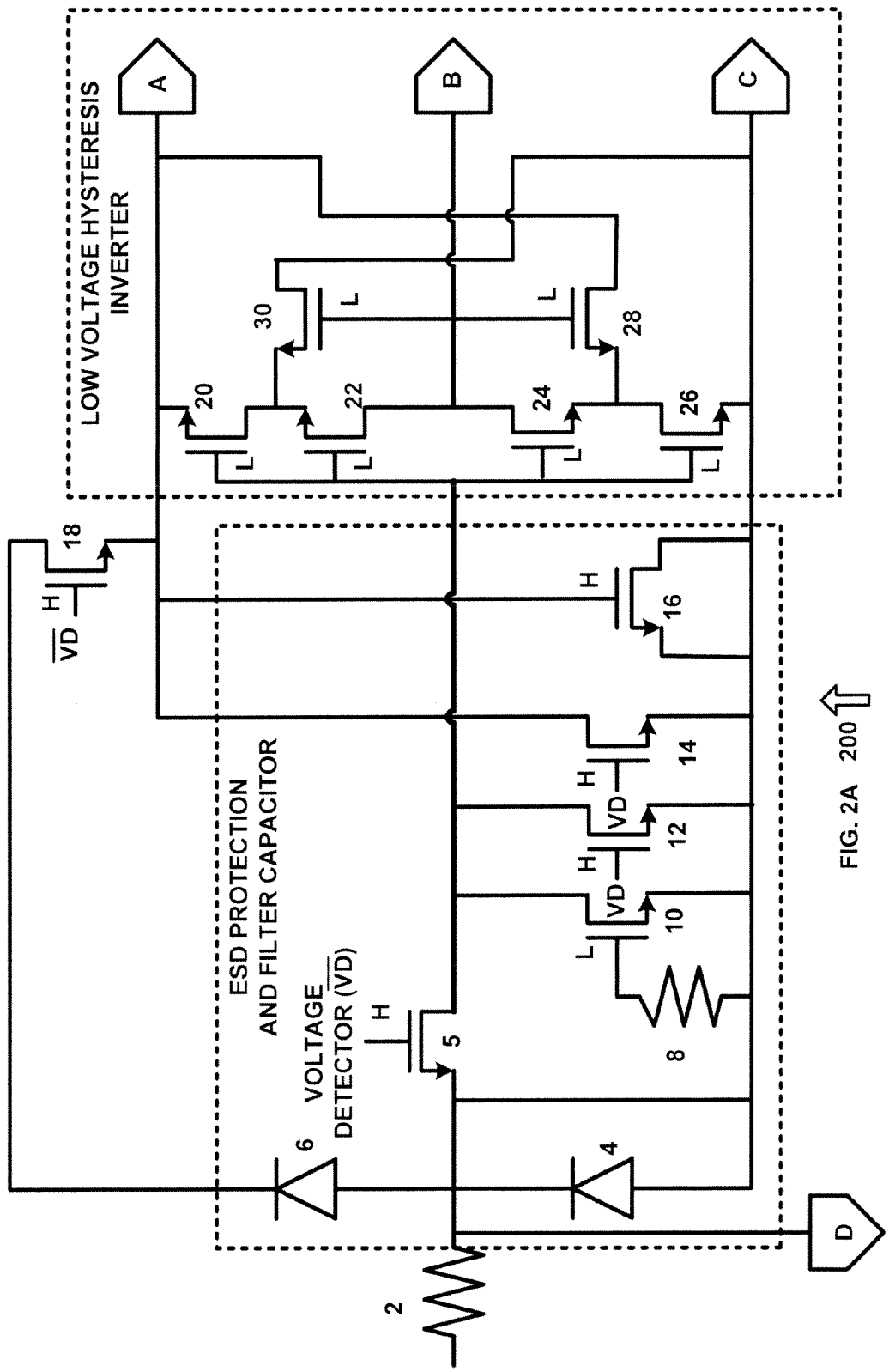
FIGS. 2A through 2C are circuit diagrams of a system for a low-power dual voltage-mode receiver for digital input/output in accordance with an exemplary embodiment of the present disclosure.
Figure 2B:
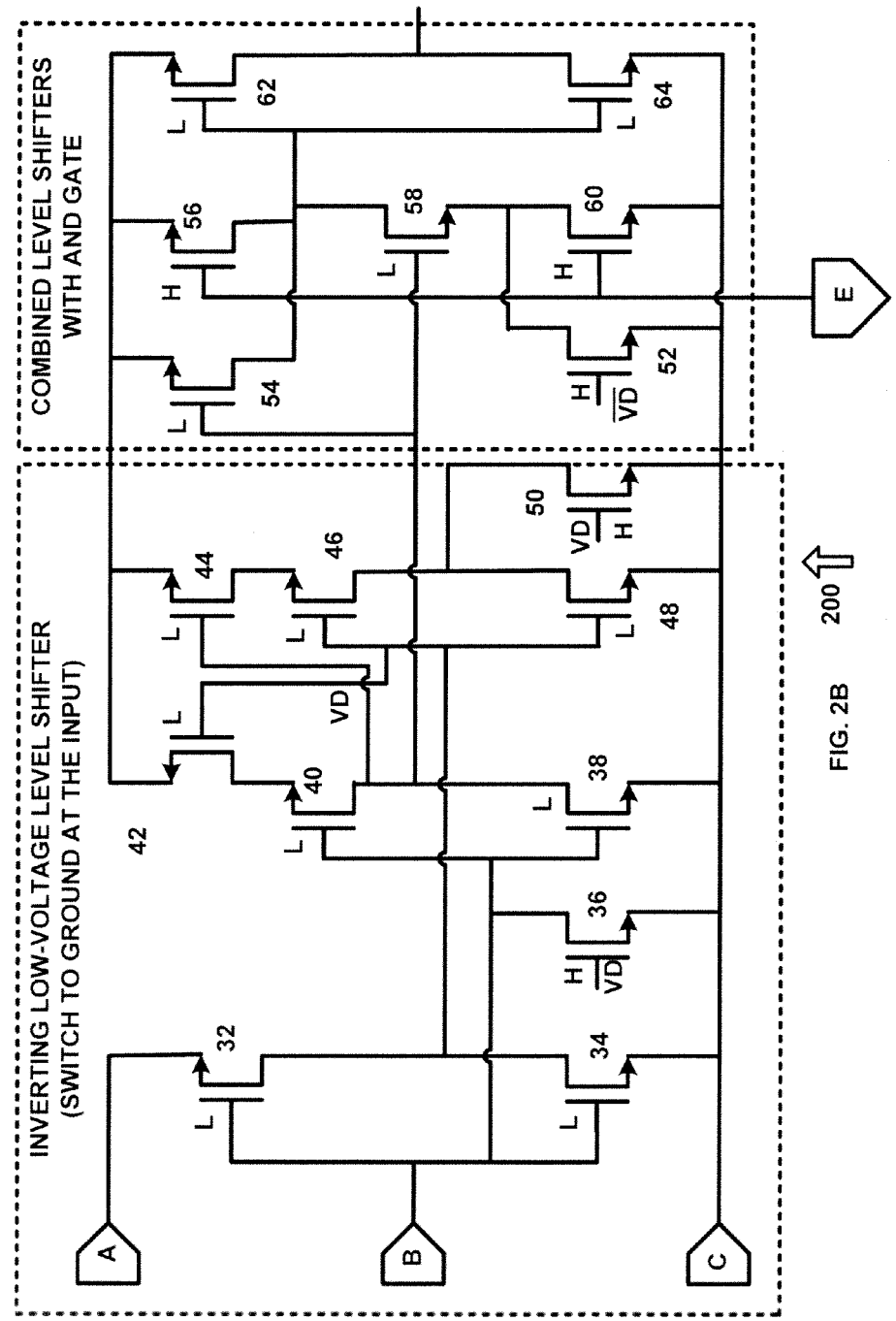
Figure 2C:
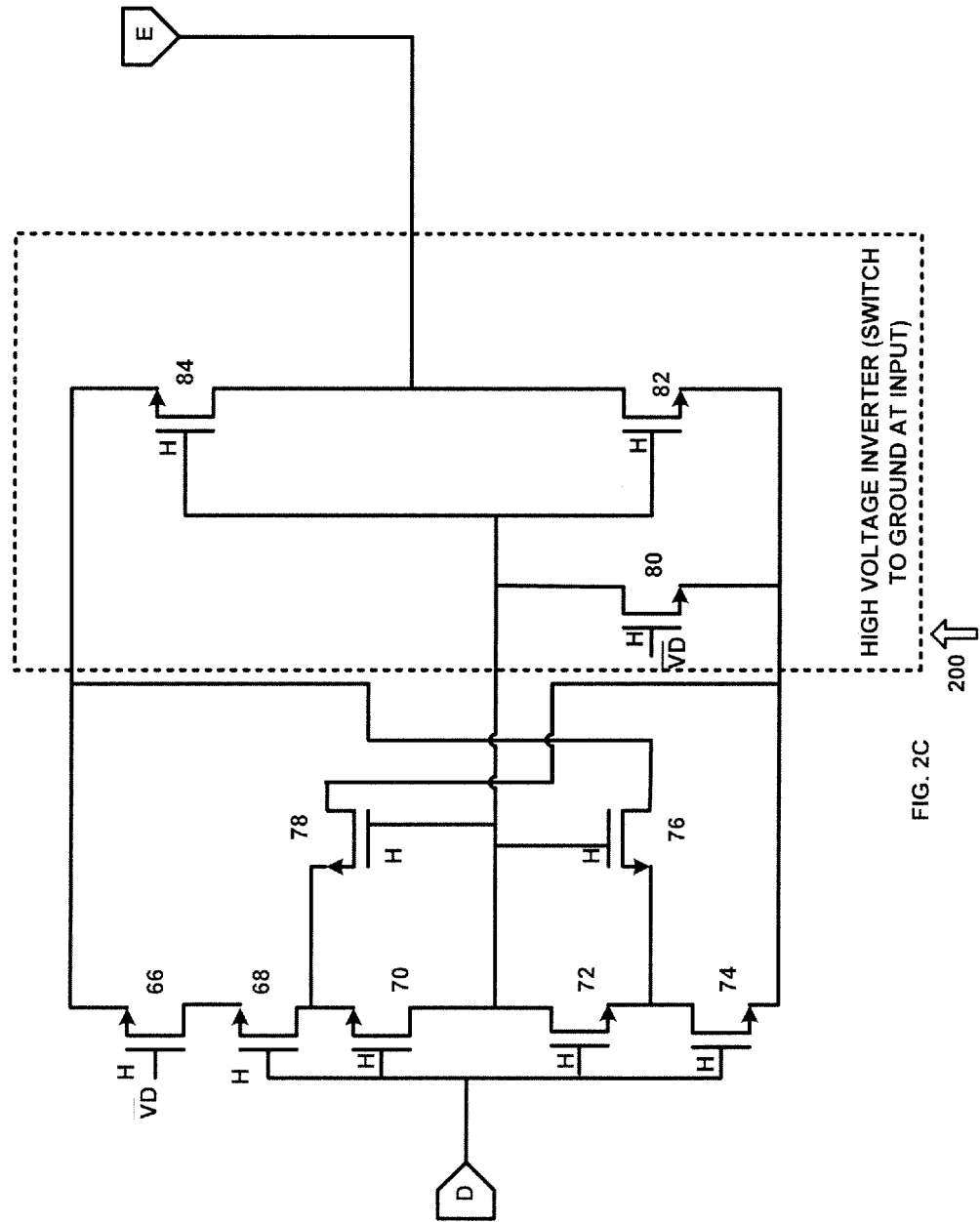

FIGS. 2A through 2C are circuit diagrams of a system 200 for a low-power dual voltage-mode receiver for digital input/output in accordance with an exemplary embodiment of the present disclosure. As shown in FIG. 2A, a series of devices are provided for protection against electrostatic discharge (ESD), which incorporates human body model (HEM) clamping plus charge device model (CDM) protection. The transistors include high voltage (H) devices having a thicker oxide layer, and low voltage devices (L) having a normal oxide layer.

In addition, FIG. 2A includes a low-voltage Schmitt trigger circuit followed by a low voltage inverter in FIG. 2B. The input is coupled to a resistor 2 and two series connected clamping diodes 4 and 6. The source of a first NMOS high voltage transistor 5 is coupled to resistor 2, and the gate of high voltage transistor 5 is coupled to an inverted voltage detector signal. The drain of a first NMOS low voltage transistor 10 is coupled to the drain of transistor 5 and the source is coupled to voltage common, with a resistor-connected gate to common through resistor 8. A second high voltage NMOS transistor 12 is also coupled between the drain of transistor 5 and ground, and the gate of transistor 12 is coupled to the voltage detector signal. The drain of transistor 5 is also coupled to low voltage transistors forming a low voltage hysteresis inverter.

A third high voltage transistor 18 has a gate coupled to the inverted voltage detect signal and is coupled from the second series-connected clamping diode 6 to the drain of an NMOS high voltage transistor 14, which has a gate coupled to the voltage detect signal. The source of transistor 18 is coupled to the gate of NMOS high voltage transistor 16, which has a drain and source coupled to ground. The low voltage hysteresis inverter is formed by two series connected low voltage PMOS transistors 20 and 22 that are coupled in series to two series connected low voltage NMOS transistors 24 and 26. The gates of the four series-connected low-voltage transistors are coupled to the drain of transistor 5. The source of low voltage PMOS transistor 30 is coupled to the junction of transistors 20 and and the drain of transistor 30 is coupled to ground, the source of a low voltage NMOS transistor 28 is coupled to the junction of the first and second low voltage NMOS transistors 24 and 26, and the drain is coupled to the source of transistor 18. The gates of transistors 28 and 30 are coupled to the junction between the first and second series connected PMOS transistors 20 and 22 and the first and second series connected NMOS transistors 24 and 26.

In FIG. 2B, two series-connected low voltage transistors (PMOS 32 and NMOS 34) are coupled between the source of transistor 18 and ground, with gates connected to the junction between the first and second series connected PMOS transistors 20 and 22 and the first and second series connected NMOS transistors 24 and 26. Two additional series-connected low voltage transistors (PMOS 40 and NMOS 38) are coupled to the drain of PMOS low voltage transistor 42 and voltage common, with gates connected to the junction between the first and second series connected PMOS transistors 20 and 22 and the first and second series connected NMOS transistors 24 and 26. The source of a low voltage PMOS transistor 44 is coupled to the source of transistor 42, and the drain of transistor 44 is coupled to the source of low voltage PMOS transistor 46. The drain of transistor 46 is coupled to the source of low voltage NMOS transistor 48. The drains of transistors 46 and 48 are coupled to the gate of transistor 42. The gate of transistor 44 is coupled to the drains of transistor 38 and 40.

In addition, the drain of a high voltage NMOS transistor 50 is coupled the drain of transistor 48, and the source of transistor 50 is coupled to voltage common. The gate of transistor 50 is coupled to a voltage detect signal.

A combined level shifter with an AND gate is formed by a low voltage PMOS transistor 54, with a gate coupled to the gates of transistors 38 and 40. The drain of transistor 54 is coupled to the drain of a high voltage PMOS transistor 56, which has a source coupled to the source of transistor 54. The drain of low voltage NMOS transistor 58 is coupled to the drain of transistor 56, and the gate of transistor 58 is coupled to the gate of transistor 54. The source of transistor 58 is coupled to the drains of high voltage NMOS transistors 52 and 60, and the sources of transistors 52 and 60 are coupled to voltage common. The gate of transistor 52 is coupled to an inverted voltage detect signal, and the gate of transistor 60 is coupled to the gate of transistor 56.

The drain of transistor 62 is coupled to the drain of low voltage NMOS transistor 64. The gates of transistors 62 and 64 are coupled to the drains of transistors 54, 56 and 58.

FIG. 2C includes a high-voltage Schmitt trigger circuit, and FIG. 2B includes combined level shifter circuits and AND gate that can be used for low voltage or high voltage level shifting, depending upon the input state. The high voltage (HV) and low voltage (LV) devices can be distinguished based on oxide coating thickness, where the HV devices have thicker oxide coatings that the LV devices.

FIG. 2C includes three series-connected high voltage PMOS transistors 66, 68 and 70 coupled in series to two series-connected high voltage NMOS transistors 72 and 74. The gates of transistors 68, 70, 72 and 74 are coupled to resistor 2, and the gate of transistor 66 is coupled to the inverted voltage detect signal. The source of high voltage PMOS transistor 78 is coupled to the junction of transistors 68 and 70 and the drain of transistor 78 is coupled to voltage common. The source of high voltage NMOS transistor 76 is coupled to the junction of transistors 72 and 74 and the drain of transistor 76 is coupled to the source of transistor 66, which is net Vdd or VIO. The gates of transistors 76 and 78 are coupled to the junction of transistors 70 and 72.

The drain of high voltage NMOS transistor 80 is coupled to the junction of transistors 70 and 72, and the source of transistor 80 is coupled to voltage common. The gate of transistor 80 is coupled to an inverted voltage detect signal. The gates of high voltage PMOS transistor 84 and high voltage NMOS transistor 82 are coupled to the junction of transistors 70 and 72, and the drain of transistor 84 is coupled to the drain of transistor 82.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A dual-voltage receiver, comprising:
   a voltage detector;
   a high voltage Schmitt trigger coupled to the voltage detector;
   a low voltage Schmitt trigger coupled to the voltage detector; and
   a combined level shifter coupled to the high voltage Schmitt trigger and the low voltage Schmitt trigger, wherein the high voltage Schmitt trigger is configured to be on and the low voltage Schmitt trigger is configured to be off when the voltage detector outputs a high voltage detect signal.

2. The dual-voltage receiver of claim 1 wherein the low voltage Schmitt trigger further comprises a non-inverting Schmitt trigger followed by an inverter.

3. The dual voltage receiver of claim 1 wherein the combined level shifter further comprises a high voltage device coupled in series with a low voltage device.

4. The dual voltage receiver of claim 1 wherein the combined level shifter further comprises a high voltage device coupled in parallel with a low voltage device.

5. The dual voltage receiver of claim 1 wherein the combined level shifter further comprises a high voltage device configured to receive a first signal from the high voltage Schmitt trigger coupled in series with a low voltage device configured to receive a second signal from the low voltage Schmitt trigger.

6. The dual-voltage receiver of claim 1 wherein the combined level shifter further comprises a high voltage device configured to receive a first signal from the high voltage Schmitt trigger coupled in parallel with a low voltage device configured to receive a second signal from the low voltage Schmitt trigger.

7. A dual-voltage receiver comprising:
   an electrostatic discharge and filter capacitor stage configured to receive an input voltage and a voltage detect signal and output a filtered signal;
   a low voltage hysteresis inverter coupled to the electrostatic discharge and filter capacitor stage configured to receive the filtered signal;
   a high voltage inverter stage coupled to the input;
   an inverting low-voltage level shifter stage coupled to the low voltage hysteresis inverter; and
   a combined level shifter with AND gate stage coupled to the inverting low-voltage level shifter stage and the high voltage inverter stage.

8. The dual-voltage receiver of claim 7 wherein the combined level shifter with AND gate stage further comprises a low voltage PMOS transistor coupled in parallel with a high voltage PMOS transistor.

9. The dual-voltage receiver of claim 7 wherein the combined level shifter with AND gate stage further comprises:
   a low voltage PMOS transistor having a drain and a source; and
   a high voltage PMOS transistor having a drain coupled to the drain of the low voltage PMOS transistor and a source coupled to the source of the low voltage PMOS transistor.

10. The dual-voltage receiver of claim 7 wherein the combined level shifter with AND gate stage further comprises:
    a low voltage PMOS transistor having a drain and a source;
    a high voltage PMOS transistor having a drain coupled to the drain of the low voltage PMOS transistor and a source coupled to the source of the low voltage PMOS transistor; and
    a low voltage NMOS transistor having a drain coupled to the source of the low voltage PMOS transistor.

11. The dual-voltage receiver of claim 7 wherein the combined level shifter with AND gate stage further comprises:
    a low voltage PMOS transistor having a drain and a source;
    a high voltage PMOS transistor having a drain coupled to the drain of the low voltage PMOS transistor and a source coupled to the source of the low voltage PMOS transistor;
    a low voltage NMOS transistor having a drain coupled to the source of the low voltage PMOS transistor and a source; and
    a high voltage NMOS transistor having a drain coupled to the source of the low voltage NMOS transistor.

12. The dual-voltage receiver of claim 7 wherein the combined level shifter with AND gate stage further comprises:
    a low voltage PMOS transistor having a drain and a source;
    a high voltage PMOS transistor having a drain coupled to the drain of the low voltage PMOS transistor and a source coupled to the source of the low voltage PMOS transistor;
    a low voltage NMOS transistor having a drain coupled to the source of the low voltage PMOS transistor and a source;
    a first high voltage NMOS transistor having a drain coupled to the source of the low voltage NMOS transistor; and
    a second high voltage NMOS transistor having a drain coupled to the source of the low voltage NMOS transistor.

13. The dual-voltage receiver of claim 11 wherein the combined level shifter with AND gate stage further comprises:
    a first low voltage PMOS transistor having a drain and a source; and
    a second low voltage PMOS transistor having a drain coupled to the drain of the first low voltage PMOS transistor and a gate coupled to the source of the first low voltage PMOS transistor.

14. A dual-voltage receiver, comprising:
    a voltage detector;
    a high voltage receiver coupled to the voltage detector;
    a low voltage receiver coupled to the voltage detector; and
    a level shifter comprising a high voltage device coupled to the high voltage receiver and a low voltage device coupled to the low voltage receiver, wherein the high voltage device is coupled to the low voltage device and the high voltage receiver is configured to be on and the low voltage receiver is configured to be off when the voltage detector outputs a high voltage detect signal.

15. The dual voltage receiver of claim 14 wherein the high voltage device coupled in series with the low voltage device.

16. The dual voltage receiver of claim 14 wherein the high voltage device coupled in parallel with the low voltage device.

17. The dual voltage receiver of claim 14 wherein the high voltage device is coupled in series to the low voltage device and in parallel to a second low voltage device.

18. The dual voltage receiver of claim 14 wherein the low voltage device is coupled in series to the high voltage device and in series to a second high voltage device.

19. The dual voltage receiver of claim 14 wherein the high voltage device is coupled in series to the low voltage device and the high voltage device and the low voltage device are coupled to a gate of a second low voltage device.

20. The dual voltage receiver of claim 14 wherein the high voltage device is coupled in series to the low voltage device and the high voltage device and the low voltage device are coupled to a gate of a second low voltage device and a gate of a third low voltage device.

\* \* \* \* \*